(12) United States Patent
Yamamoto et al.

(10) Patent No.: US 7,062,347 B2
(45) Date of Patent: Jun. 13, 2006

(54) MAINTENANCE METHOD AND SYSTEM FOR PLASMA PROCESSING APPARATUS

(75) Inventors: Hideyuki Yamamoto, Kudamatsu (JP); Toshio Masuda, Toride (JP); Shoji Ikuhara, Hikari (JP); Akira Kagoshima, Kudamatsu (JP); Junichi Tanaka, Tsuchiura (JP)

(73) Assignee: Hitachi, Ltd., Tokyo (JP)

( * ) Notice: Subject to any disclaimer, the term of this patent is extended or adjusted under 35 U.S.C. 154(b) by 185 days.

(21) Appl. No.: 10/434,213

(22) Filed: May 9, 2003

(65) Prior Publication Data
US 2003/0201240 A1 Oct. 30, 2003

Related U.S. Application Data

(63) Continuation of application No. 09/946,621, filed on Sep. 6, 2001, now Pat. No. 6,745,096.

(30) Foreign Application Priority Data

Jul. 26, 2001 (JP) .............................. 2001-226702

(51) Int. Cl.
*G06F 19/00* (2006.01)
(52) U.S. Cl. ............................ 700/117; 700/121; 438/5
(58) Field of Classification Search ................. 700/29, 700/90, 117, 121; 438/5
See application file for complete search history.

(56) References Cited

U.S. PATENT DOCUMENTS

| 4,967,337 | A | * | 10/1990 | English et al. ................. 700/79 |
| 5,730,801 | A | * | 3/1998 | Tepman et al. ............. 118/719 |
| 5,883,017 | A | | 3/1999 | Tepman et al. |
| 6,017,414 | A | | 1/2000 | Koemtzopoulos et al. |
| 6,146,492 | A | | 11/2000 | Cho et al. |
| 6,192,287 | B1 | | 2/2001 | Solomon et al. |
| 6,375,743 | B1 | * | 4/2002 | Sundarrajan et al. ....... 118/697 |
| 2002/0183977 | A1 | * | 12/2002 | Sui et al. ...................... 702/188 |

FOREIGN PATENT DOCUMENTS

| JP | 05-060645 | | 3/1993 |
| JP | 05-291188 | | 5/1993 |
| JP | 11-054485 | | 2/1999 |
| JP | 2000-195805 | A | 7/2000 |
| JP | 2001-196361 | A | 7/2000 |

* cited by examiner

*Primary Examiner*—Jayprakash N. Gandhi
(74) *Attorney, Agent, or Firm*—Antonelli, Terry, Stout and Kraus, LLP.

(57) ABSTRACT

For maintenance after wet cleaning of a plasma processing apparatus which processes a specimen in a vacuum processing chamber by using a plasma, when restoration processing after the wet cleaning of members configuring the vacuum processing chamber is performed with the vacuum processing chamber opened to the atmosphere, it is automatically or semiautomatically judged whether the restoration processing is appropriate or not according to a predetermined optimum sequence inherent in the apparatus, and the next processing is started automatically or semiautomatically according to the results.

16 Claims, 7 Drawing Sheets

PROCESSING AFTER WET CLEANING BY THE INVENTION
(WITH APPARATUS STATE MONITOR & RATE MONITOR)

WET OPERATION COMPLETED AND BUTTON PRESSED BY OPERATOR
↓
START OF EVACUATION
    ↓ (AUTOMATIC JUDGMENT OF LEAK)
CHECK OF LEAK RATE AND ATTAINED DEGREE OF VACUUM
    ↓ (AUTOMATIC JUDGMENT, IF NG, AUTOMATICALLY RETRIED)
DUMMY RUN
(RATE QC WAFERS ARE SET TO FOLLOW THE LAST DUMMY WAFER)
    ↓ (AUTOMATIC JUDGMENT OF DISCHARGING STATE BY APPARATUS STATE MONITOR)
    ↓ (AUTOMATIC MEASUREMENT/JUDGMENT OF RATE BY RATE MONITOR)

↓ (INDICATION OF VACUUM CHECK AND DUMMY RUN COMPLETED)

FOREIGN SUBSTANCE QC WAFER SET (PRE-MEASUREMENT)
↓
FOREIGN SUBSTANCE QC
↓
FOREIGN SUBSTANCE CHECK (POST-MEASUREMENT)
    ↓ OK?
PREPRODUCTION WAFER PROCESSED
    ↓ OK?
WET OPERATION COMPLETED, AND PRODUCT PROCESSING STARTED

FIG. 6

PROCESSING AFTER WET CLEANING BY THE INVENTION
(SYSTEM WITH THE FOREIGN SUBSTANCE MONITOR)

WET OPERATION COMPLETED AND BUTTON PRESSED BY OPERATOR
↓
EVACUATION STARTED
  ↓ (AUTOMATIC JUDGMENT OF LEAK)
CHECK OF LEAK RATE AND ATTAINED DEGREE OF VACUUM
  ↓ (AUTOMATIC JUDGMENT, IF NG, AUTOMATICALLY RETRIED)
DUMMY RUN
(RATE QC AND FOREIGN SUBSTANCE QC WAFERS ARE SET TO FOLLOW THE LAST DUMMY WAFER)

↓ (AUTOMATIC MEASUREMENT/JUDGMENT OF THE ELECTRIC DISCHARGE STATE BY THE
     APPARATUS STATE MONITOR)

↓ (AUTOMATIC MEASUREMENT/JUDGMENT OF RATE OF RATE QC WAFER BY RATE MONITOR)

↓ (AUTOMATIC MEASUREMENT/JUDGMENT OF FOREIGN SUBSTANCES IN THE ELECTRIC
     DISCHARGE SPACE BY THE FOREIGN SUBSTANCE MONITOR)

↓ (INDICATION OF RESULTS BY THE AUTOMATIC MEASUREMENT/JUDGMENT)

↓ OK?
PREPRODUCTION WAFER PROCESSED
  ↓ OK?
WET OPERATION COMPLETED, AND PRODUCT PROCESSING STARTED

FIG. 7 - PRIOR ART

PROCESSING AFTER WET CLEANING AT PRESENT

WET OPERATION COMPLETED
↓
EVACUATION STARTED
↓ IN ABOUT TWO HOURS
LEAK CHECK/ATTAINED PRESSURE CHECK
↓ OK? (IF NG, RETRIED LATER)
TRANSFER -, GAS DISCHARGE - FOREIGN SUBSTANCE CHECK
(PRE-MEASUREMENT, QC, POST-MEASUREMENT)
↓ OK?
DUMMY RUN (ELECTRIC DISCHARGE CHECK)
↓
ELECTRIC DISCHARGE FOREIGN SUBSTANCE CHECK
(PRE-MEASUREMENT, QC, POST-MEASUREMENT)
↓ OK?
RATE CHECK (PRE-MEASUREMENT, QC, POST-MEASUREMENT)
↓ OK?
PREPRODUCTION WAFER PROCESSED
↓ OK?
WET OPERATION COMPLETED, AND PRODUCT PROCESSING STARTED

MAINTENANCE METHOD AND SYSTEM FOR PLASMA PROCESSING APPARATUS

CROSS-REFERENCE TO RELATED APPLICATION

This is a §53(b) Continuation of U.S. application Ser. No. 09/946,621 filed 6 Sep. 2001, now U.S. Pat. No. 6,745,096.

BACKGROUND OF THE INVENTION

The present invention relates to a maintenance method and system for a plasma processing apparatus having a vacuum processing chamber, and more particularly to maintenance during a restoring operation after completing the maintenance such as wet cleaning involving the opening of the vacuum processing chamber to the atmosphere.

Conventionally, the restoring operation after the maintenance involving the opening of a plasma processing apparatus to the atmosphere needs to check whether the air etc. Leaks out of the vacuum processing chamber after starting vacuum evacuation, to check an attained pressure in the vacuum processing chamber, to check an amount of conveyed foreign substances and an amount of foreign substances produced by an electric discharge, and to check an etching rate or a film forming rate. Besides, because a judgment in each operation stage must be made based on experiences, it is necessary to have a person to operate or decide in each stage.

Figure 7:
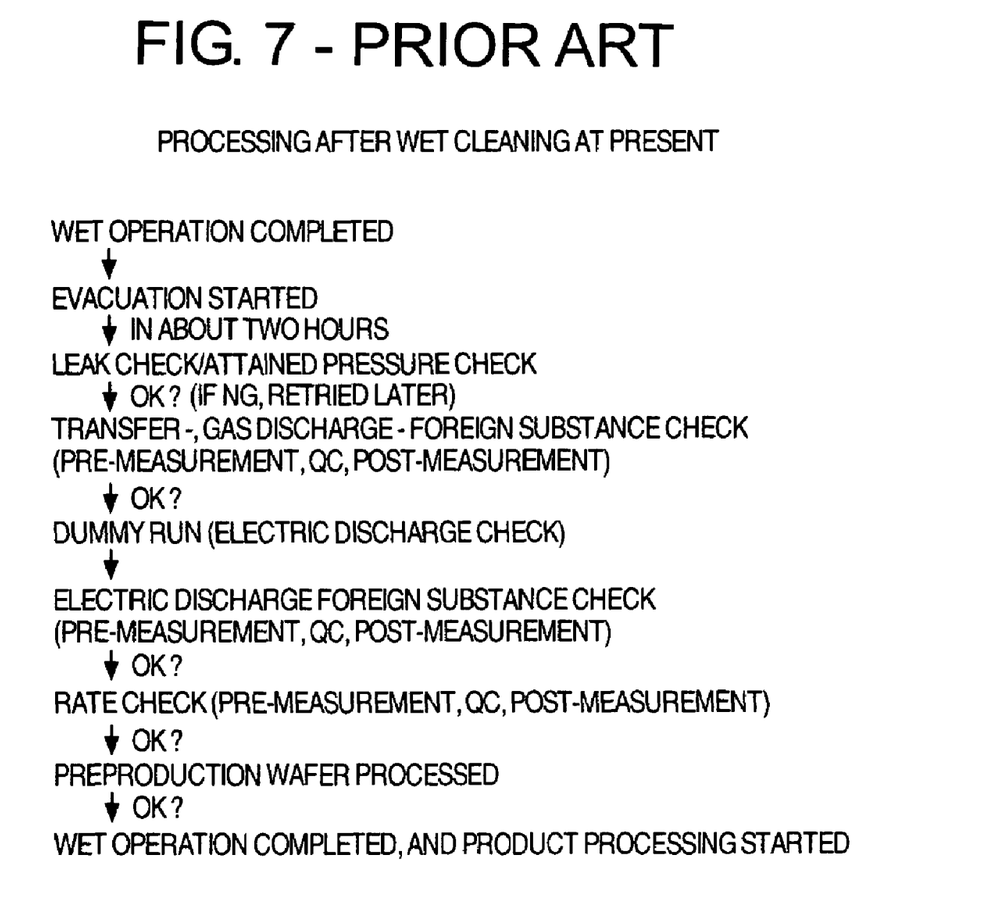
FIG. 7 is a diagram showing an example processing procedure after the wet cleaning by a conventional method.

FIG. 7 shows an example of a processing procedure after wet cleaning according to a conventional method.

After completing a wet operation, the evacuation by a vacuum pump is started. Then, a leak check and an attained pressure check are performed in about two hours. If their results are NG (no good), the evacuation is performed again. And, if they are OK, a transfer, a gas discharge, a foreign substance check (that is, the checking of the increase of the number of foreign substances on a foreign substance checking wafer before and after QC (quality control such as the transfer processing)) (pre-measurement before QC, QC, post-measurement after QC) are performed. If they are OK, a dummy run (checking of the electric discharge using checking sample) is performed. Besides, an electric discharge foreign substance check (that is, the checking of the increase of the number of foreign substances on a foreign substance checking wafer before and after QC (discharge processing in this case)) (pre-measurement before QC, QC, post-measurement after QC) is performed, and if it is OK, a rate check (checking of the etching rate or the film forming rate) (pre-measurement before QC, QC, post-measurement after QC) is performed. If it is OK, processing of preproduction wafers (that is, the processing of an actual wafer before the production of the wafers) is started, and if it is OK, the wet operation is terminated. Then, processing of products is started.

SUMMARY OF THE INVENTION

As described above, the restoring operation after the maintenance work by the conventional method often requires the intervention of a person and the decision by a person. Therefore, the efficiency of work is poor, many people are required to start the operation and it takes lots of time to restore.

Accordingly, it is an object of the present invention to provide a maintenance method and system for a plasma processing apparatus which can omit complex works requiring the intervention of people and a judgment for pass or fail (suitability of processing) in each stage of restoration processing based on experiences and can realize saving of the manpower before starting the operation or shortening of restoration time.

One aspect of the invention is directed to a maintenance method after wet cleaning of a plasma processing apparatus which processes a specimen by plasma in a vacuum processing chamber, wherein:

when restoration processing after the wet cleaning of members configuring the vacuum processing chamber is performed with the vacuum processing chamber opened to the atmosphere for maintenance or the like, it is automatically or semiautomatically judged whether the restoration processing is appropriate or not according to a predetermined optimum sequence inherent in the apparatus, and the next processing is started automatically or semiautomatically according to the results.

Another aspect of the invention is directed to a maintenance system for a plasma processing apparatus, which is provided with a vacuum processing chamber, a vacuum evacuation section, a plasma generating gas supply section, a plasma generating section, and a specimen stage on which a wafer to be processed in the vacuum processing chamber is placed, which comprises an operation circuit for performing a sequence for a restoring operation after wet cleaning, a storage section for storing measured data, a plurality of detection sensors for collecting measured data values from the operating plasma processing apparatus, an I/O section for determining prescribed values, and a comparison/decision circuit for comparing the prescribed values with the data stored in the storage section.

According to the present invention, the complex works requiring the intervention of people are previously combined as an optimum sequence inherent in the apparatus, a check program is semiautomatically or automatically activated according to the sequence, it is judged whether each stage of the restoration processing has passed or failed (whether the processing is appropriate or not), and according to the results, the processing can be proceeded semiautomatically or automatically to the next stage and processing, so that the manpower before starting the operation can be saved or the restoration time can be shortened.

DETAILED DESCRIPTION OF THE EMBODIMENTS

Figure 1:
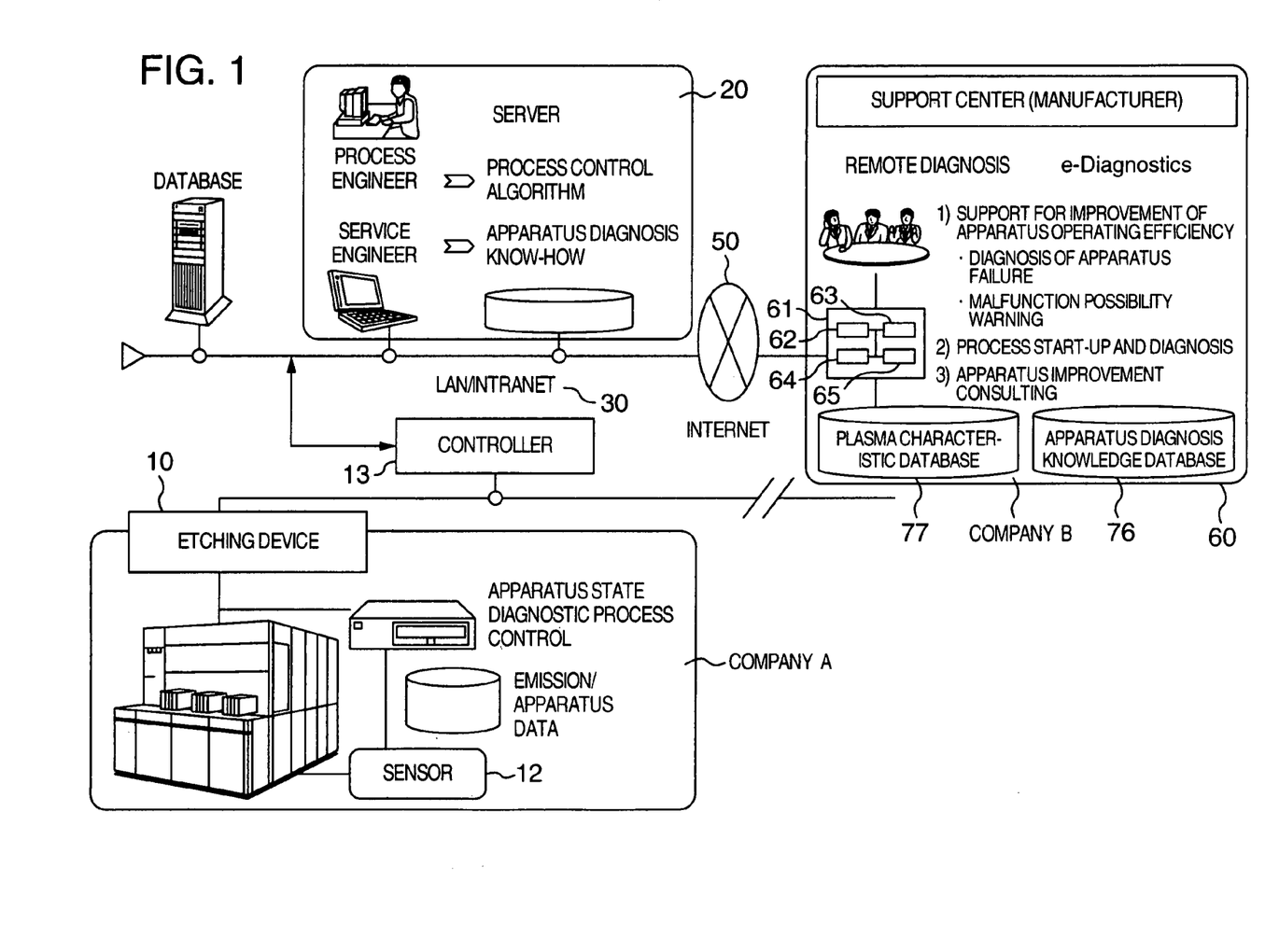
FIG. 1 is a block diagram showing the structure of a remote diagnostic system with the present invention applied to semiconductor production equipment.

Embodiments of the present invention will be described in detail below. FIG. 1 is a block diagram showing the structure of a remote diagnostic system with the present invention applied to semiconductor production equipment. This diagnostic system performs periodically or as required a remote diagnosis of a semiconductor production equipment 10 (plasma etching device) which is administered by Company A by means of a diagnostic apparatus 60 of Company B (support center) which is not administered by Company A. It is assumed in this embodiment that Company B is a manufacturer having produced and delivered a part or most of the semiconductor production equipment of Company A. Company B may be a service company specialized in maintenance.

This remote diagnostic system has the etching device 10 (may be two or more) of Company A, which is subjected to a failure diagnosis or data update, connected to a semiconductor production equipment control server 20 of Company A through a controller 13 and a LAN. The server 20 is connected to a LAN (Intranet) 30 of Company A and also connected to Internet 50 via an unshown Internet server and firewall system. A diagnostic device 60 of the support center is connected to the Internet 50 via an unshown firewall system and Internet server (end Intranet) of Company 13.

The remote diagnostic system of Company B includes, for example, a sequence executing operation circuit 62, a storage section 63 for storing measured data, an I/O section 64 for determining prescribed values, and a comparison/decision circuit 65 for comparing a prescribed value with data stored in the storage section, which are configured in a personal computer 61. A plurality of detection sensors 12 collect various kinds of measured data values from the operating plasma processing apparatus of Company A or inquires about data obtained by Company A and receives them through the Internet. As the aforesaid detection sensors, an emission spectrometer OES (optical emission spectroscopy) 113 (see FIG. 2) for measuring a plasma emission intensity with a single or plurality of wavelengths is disposed.

A common telephone line, a dedicated communications line, an optical fiber communications line or the like is used to connect the semiconductor production equipment, individual servers, the Internet and the diagnostic device. It is needless to say that an IP address and a particular ID number are previously allotted to individual equipment for communications between the customer A and the device manufacturer B.

Each server is composed of a computer and has operating sections such as a keyboard and a mouse and a display as I/O elements. It also has browsing software (WWW browser) which is used to access to the Internet 50 and to connect to another server. Each computer such as the server 20 is provided with a communications interface which modulates and transmits data and commands generated by the microcomputer and also receives and demodulates data and commands transmitted through a telephone line or the like.

Each semiconductor production equipment 10 is also provided with a personal computer and operating sections such as a keyboard and a mouse and a display as I/O elements.

The diagnostic device 60 is comprised of a personal computer for example, and provided with an externally connecting interface to connect to external equipment and a communications interface. Besides, the personal computer has a CPU and various types of storage sections. The storage sections holds browsing software (WWW browser) for accessing to the Internet 50 to connect to a server and a diagnostic program for a remote diagnosis. In addition, the diagnostic device 60 is provided with a database 76 on information for device diagnosis such as error codes of the apparatus and device diagnosis information, a plasma characteristic database 77, regular or irregular diagnosis database inherent in the customer, a database on diagnosis schedules and diagnostics results, etc.

The diagnostic device 60 uses a communications line to make an online detection or an inquiry about various kinds of information related to the semiconductor production equipment 10 of Company A by the detection sensors 12, makes a diagnosis and supports a maintenance based on the obtained information, and if additional information is required for a diagnosis, requests Company A for additional information before making a diagnosis.

Figure 2:
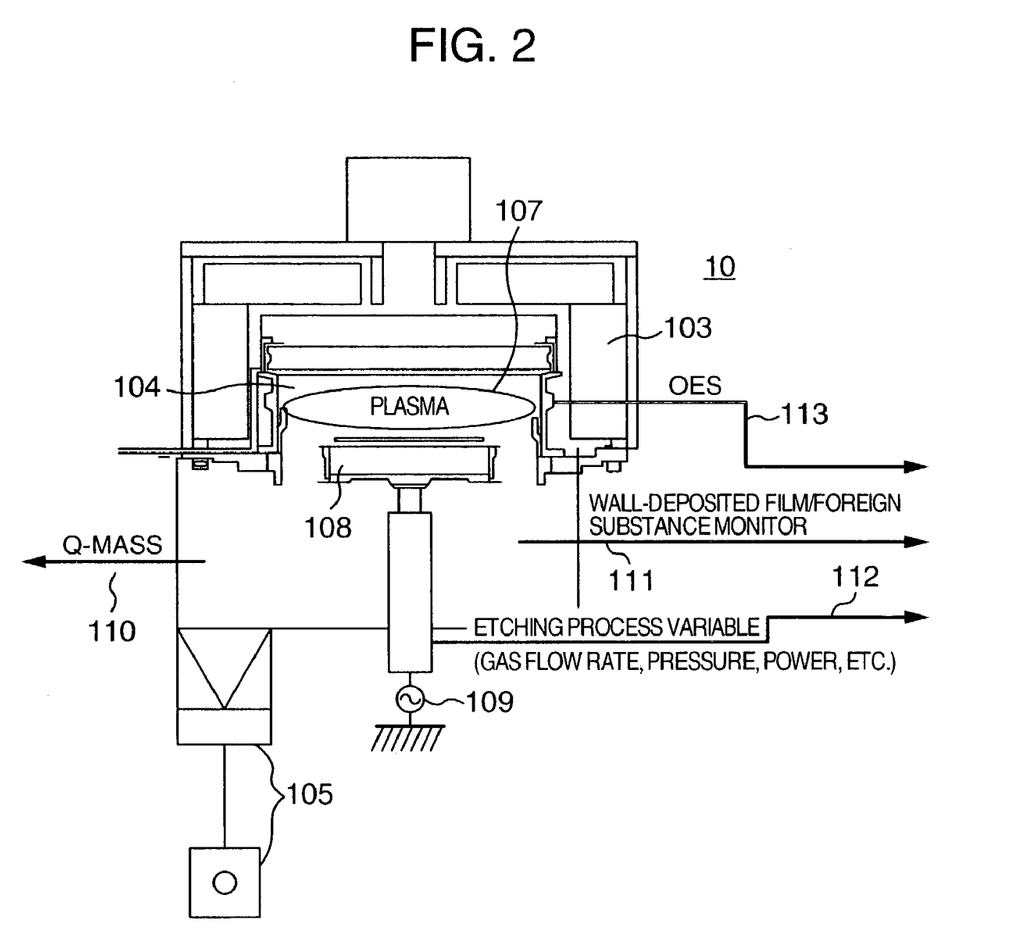
FIG. 2 is a general structure diagram of a vacuum processing apparatus for plasma etching.

FIG. 2 is a general structure diagram of a vacuum processing apparatus for plasma etching. The vacuum processing apparatus has a vacuum processing chamber 104, a vacuum evacuating section 105 by a vacuum pump, a plasma generating gas supplying section, a plasma generating section for generating a plasma 107 in the vacuum processing chamber 104, and a specimen stage 108 on which a wafer to be processed in the vacuum processing chamber 104 is placed.

A microwave is introduced from a microwave power source into the vacuum processing chamber 104. An electromagnet 103 is disposed around the vacuum processing chamber 104, a magnetic field strength is determined to cause resonance with a frequency of the microwave. For example, when the frequency is 2.45 GHz, the magnetic field strength is 875 gausses. A specimen is placed on the specimen stage 108. A high-frequency voltage source 109 is connected to the specimen stage 108 to accelerate ions to be entered into the specimen. The high-frequency voltage source 109 is not limited to have a particular frequency, but the frequency is generally practical in a range of 200 kHz to 20 MHz. The microwave source and a bias power source 109 each are provided with a pulse signal generator for controlling their ON/OFF.

As the detection sensor for collecting various measured data values from the operating plasma processing apparatus 10 of Company A, a mass gas analyzer Q-MASS (quadro pole mass spectroscopy) 110 for detecting molecules or atoms of arbitrary mass is also incorporated. Besides, a foreign substance inspection device (foreign substance monitor) and a thickness measuring device 111 which detects a thickness by measuring interference light from the wafer surface when external light or light which is generated by the plasma itself is irradiated to the surface of a wafer are incorporated. In addition, in order to detect an etching process variable, a detector 112 for measuring a high-frequency output voltage, a current, a phase, a reflected wave power, etc. is incorporated.

According to the invention, when a restoring operation of the plasma etching processing apparatus 10 is to be made after the wet cleaning of the vacuum processing chamber-configuring members performed with the vacuum processing chamber opened to the atmosphere for maintenance or the like, it is instructed from the remote diagnostic system of Company B, and the pass/fail judgment of the restoration processing is made automatically or semiautomatically (judgment whether the restoration processing is appropriate or not) in accordance with a predetermined optimum sequence inherent in the apparatus. And, the next processing is started automatically or semiautomatically according to the obtained result. Thus, a saving of manpower required for starting the operation or the reduction of restoration time can be realized.

Figure 3:
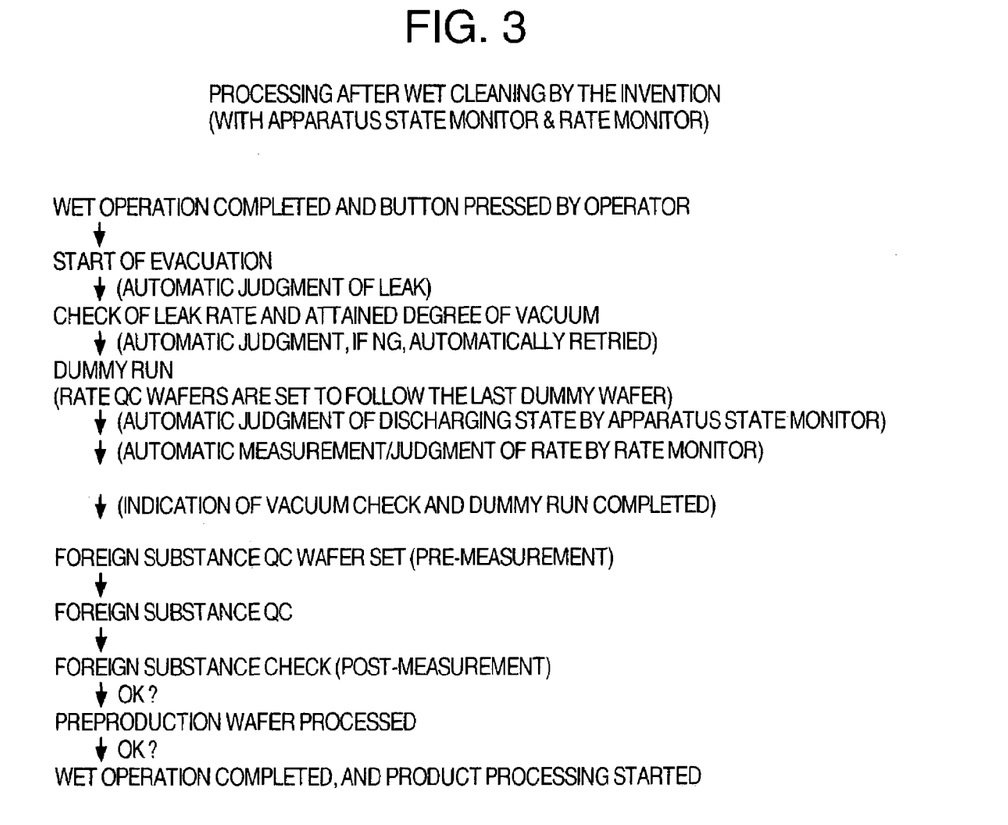
FIG. 3 is a diagram showing a sequence of restoring operation for processing after the wet cleaning by the present invention.

FIG. 3 shows a sequence of restoring operation after the wet cleaning according to the present invention. This embodiment has a device state monitor and a rate monitor.

First, when the wet operation is completed, an operator presses a button to start the evacuation (high vacuum evacuation processing) by the vacuum pump. As an item of the sequence of restoring operation and the pass/fail judgment of the restoration processing, an attained pressure and attained time at the high vacuum evacuation of the vacuum processing chamber are used to automatically determine the presence or not of a leakage. In other words, a leak rate and an attained degree of vacuum are checked. Such checks are performed according to an automatic judgment, and if the results are NG, namely the attained degree of vacuum is inappropriate, the check is retried automatically.

Figure 4:
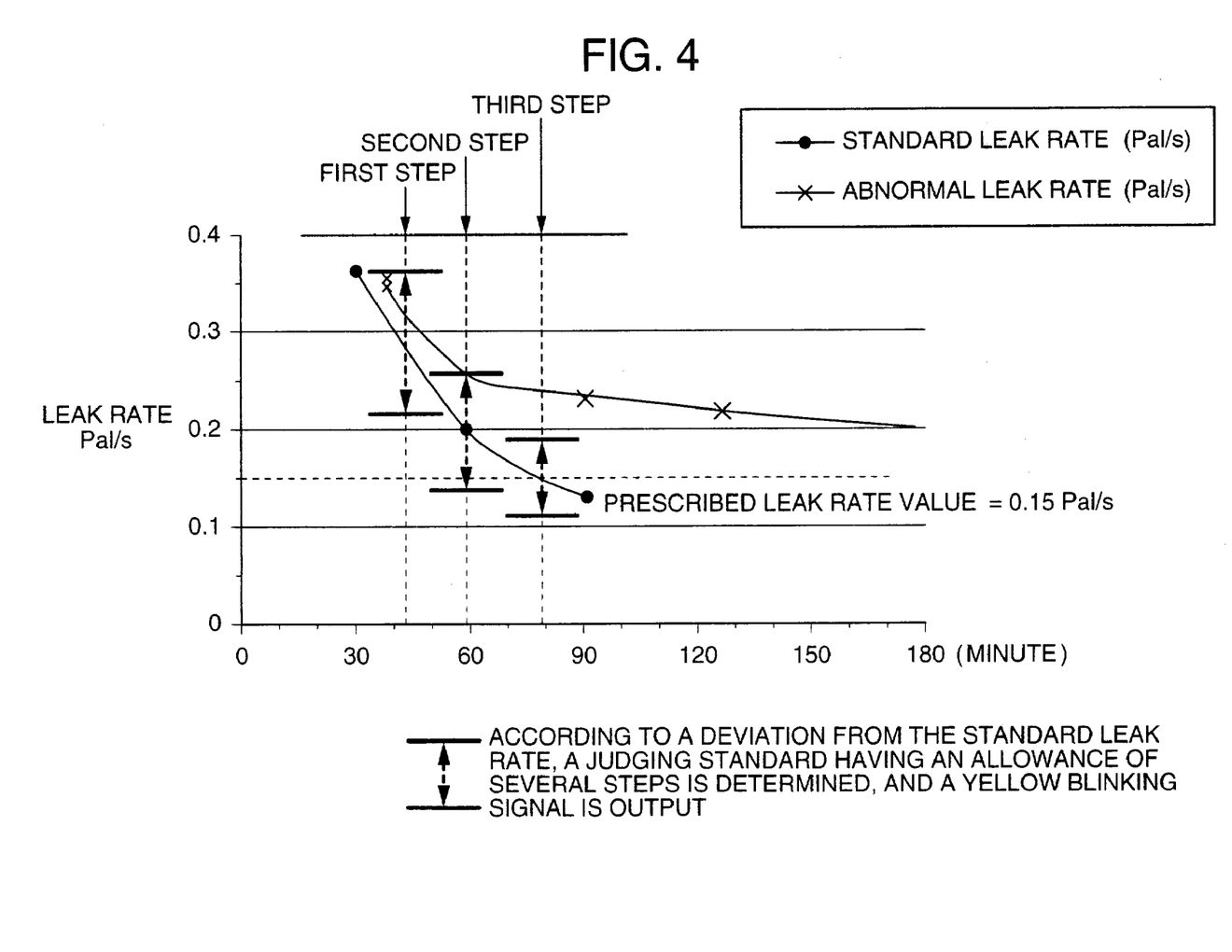
FIG. 4 is a diagram showing an example of lapses of time of degrees of vacuum attained at a standard leak rate and an abnormal leak rate.

FIG. 4 shows an example of lapses of time for the degrees of vacuum attained at a standard leak rate and an abnormal leak rate. The leak rate means a value of a pressure rise rate measured when a valve of the vacuum processing chamber is closed for example every 30 minutes in the evacuation processing. The valve is then reopened to resume the evacuation. It is judged whether the attained degree of vacuum is normal or not according to a criterion having a predetermined allowance for the degree of vacuum for each judgment step. The allowance of the criterion (in a vertical direction in FIG. 4) is determined to become narrow as the steps proceed, so that it can be predicted in an early stage whether the attained degree of vacuum is normal or not. In the example shown in FIG. 4, a mark "●" indicates normal, and a mark "X" indicates abnormal. In FIG. 4, a first step has a wide allowance for the criterion, which includes both of normal and abnormal examples therein. A second step has the normal example within the criterion but the abnormal example is in the proximity of the upper limit of the criterion. When the attained degree of vacuum is in the proximity of the upper limit or the lower limit (a range from the upper limit to a value smaller by a predetermined value than the upper limit or a range from the lower limit to a value larger by a predetermined value than the lower limit) of the criterion, it is effective to give a warning to the operator because measures can be taken in an early stage. To give a warning, it may be designed to give a warning sound, illuminate a warning lamp or indicate a warning on the monitor of the personal computer. A third step has the normal example within the criterion but the abnormal example deviated from the criterion. When the attained degree of vacuum has a tendency as described above, it is predicted that the continuation of the evacuation results in abnormality. Therefore, a warning signal about abnormality is issued. Otherwise, the evacuation processing may be retried. The allowance of the criterion may be determined upon knowing a vacuum attainment curve with a lapse of time. For example, it is possible to take statistics of the vacuum attainment curve when the result is abnormal and to determine the allowance so that the statistical value becomes the upper limit or the lower limit.

As an item of the restoring operation sequence and the pass/fail judgment of the restoration processing, not only the attained pressure and time at the high vacuum evacuation of the vacuum processing chamber but also the vacuum attainment curve with a lapse of time to the attainment are determined, and a single or plurality of analytical results of numerical values of an inclination and the like obtained by differential calculation or the like are combined. Thus, when it is judged that the attained degree of vacuum is inappropriate, it is advised to the operator by a yellow blinking signal for example.

As an item of the aforesaid sequence and the pass/fail judgment, it is allowed that the residual gas in the vacuum processing chamber by the high vacuum evacuation is accumulated in the vacuum processing chamber by interrupting an exhaust system, e.g., by closing a discharge valve, an electric discharge is performed by an appropriate plasma generating method to observe its emission spectrum so to know residual gas components, and the obtained results are used alone or in combination and over time.

Relative amounts of nitrogen (N), hydrogen (H) or OH may be obtained as the aforesaid residual gas components, and the results may be used alone or in combination and over time. Otherwise, as an item of the aforesaid sequence and the pass/fail judgment, the residual gas components in the vacuum processing chamber by the high vacuum evacuation may be obtained by a mass gas spectrometer or the like to use the obtained results alone or in combination and over time.

Figure 5:
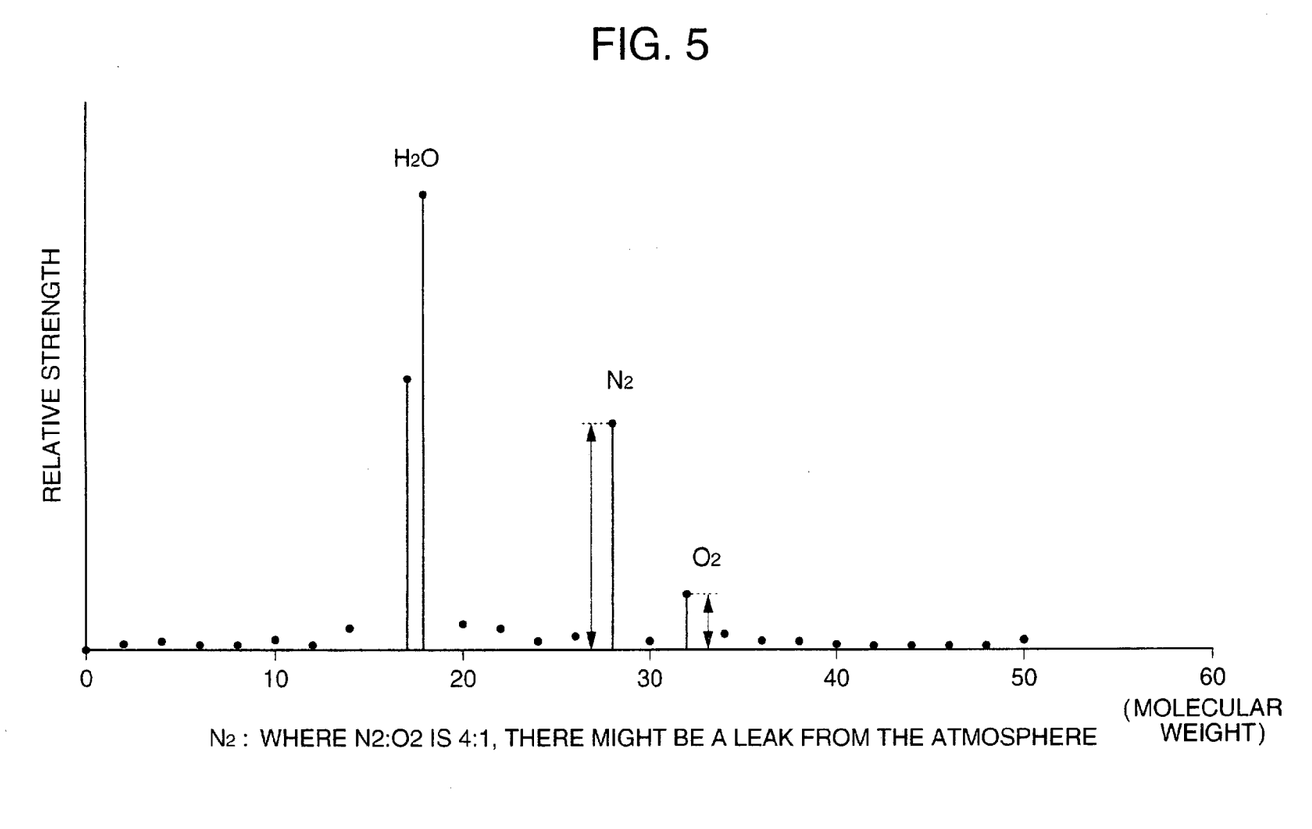
FIG. 5 is a diagram showing an example measurement using Q-MASS during vacuum evacuation.

Otherwise, among the residual gas components within the vacuum processing chamber, it may be judged whether a content ratio of nitrogen and oxygen becomes 4:1 to determine whether there is a leakage from the outside of the vacuum processing chamber.

FIG. 5 shows a measurement example using Q-MASS 110 during the vacuum evacuation, which is used to determine the presence or not of a leakage from the outside of the vacuum processing chamber on the basis of the content ratio of nitrogen and oxygen.

Referring back to FIG. 3, a dummy run is then performed when the attained degree of vacuum is normal. Specifically, a rate QC wafer (a wafer checking the etching or film forming rate) is set to follow the last wafer. The state of an electric discharge is automatically determined by the device state monitor. And, the etching or film forming rate is automatically measured and judged by the rate monitor.

Then, it is indicated that the vacuum check and the dummy run have completed.

Besides, a foreign substance QC wafer (a wafer for checking foreign substance) is set to perform the pre-measurement, and a foreign substance QC wafer is set to perform the post-measurement. If the result is OK, preproduction wafers are processed. And, if there is not any problem, the wet operation is terminated, and the processing of products is started.

Figure 6:
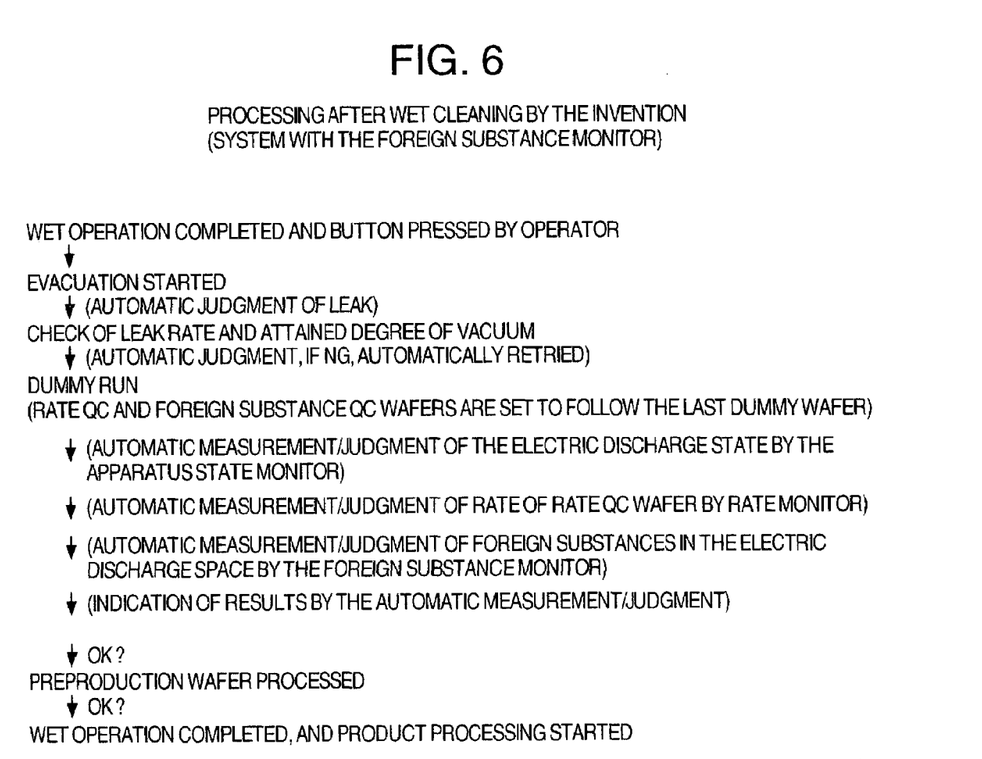
FIG. 6 is a diagram showing an example processing after the wet cleaning by another embodiment of the invention.

FIG. 6 shows an example processing after the wet cleaning by another embodiment of the invention. This example is directed to a system provided with a foreign substance monitor 111. First, when the wet operation completes, the operator presses the button to start the evacuation. And, the presence or not of a leakage is automatically determined. A leak rate and an attained degree of vacuum are checked and automatically judged. If they are NG, they are retried automatically. If they are OK, a dummy run is performed. Specifically, a rate QC wafer and a foreign substance QC wafer are set to follow the last dummy wafer. Then, the state of an electric discharge is automatically measured and determined by the apparatus state monitor.

A rate of the rate QC wafer is automatically measured and judged by the rate monitor, and foreign substances contained in the electric discharge space are automatically measured and judged by the foreign substance monitor 111. The obtained results are indicated on the display.

Thus, as an item of the sequence and the pass/fail judgment, in order to check that the produced amount of foreign substances in the vacuum processing chamber is not more than a prescribed value, a built-in type or separate type foreign substance inspection device is used. When the produced amount of foreign substances in the vacuum processing chamber exceeds the prescribed value, a foreign substance reduction sequence is semiautomatically or automatically activated to repeat several times a gas purge and discharge of the vacuum processing chamber.

As an item of the sequence and the pass/fail judgment of this example, a built-in type or separate type thickness measuring device may be used to check that a predetermined etching rate or a film forming rate are within the range of prescribed values. As an etching process variable, various parameters such as a voltage, a current, a phase and a reflected wave power related to a predetermined plasma discharge may be measured and checked that they are within the range of prescribed values.

Referring back to FIG. 6, if the results of the automatic measurement and judgment are OK, processing of preproduction wafers is started. If the results are OK, the wet operation is completed, and processing of products is started.

The diagnostic device 60 may be owned by Company A to diagnose the semiconductor production equipment 10.

According to the present invention, the conventional complex works requiring the intervention of people and the pass/fail judgment in each stage on the basis of experiences can be omitted, and semiautomatic or automatic processing can be made. In other words, a saving of manpower required for starting the operation or the reduction of restoration time can be realized by previously combining such complex works as the optimum sequence inherent in the apparatus.

What is claimed is:

1. An automated restoration processing method after maintenance of a plasma processing apparatus which processes a specimen by plasma in a vacuum processing chamber, comprising:
   when performing restoration processing after maintenance with the vacuum processing chamber opened to the atmosphere for maintenance or the like, using an operation circuit for performing a sequence for a restoring operation after maintenance as to each of plurality of inspection items during a restoring operation as to one of the plurality of inspection items according to a sequence for the restoring operation as to the plurality of inspection items,
   obtaining measured data value from the plasma processing apparatus,
   then comparing the measured data value with a pre-given criterion, and
   when the measured data value is within the pro-given criterion, determining the restoring operation as to the one of the plurality of inspection items to be appropriate thereby to perform a restoring operation as to another one of the plurality of inspection items.

2. The restoration processing method according to claim 1, wherein as an item for judging whether or not the restoration processing is appropriate, a relation between an elapsed time of processing and an attained pressure within said vacuum processing chamber at that time in the high vacuum evacuation processing of the vacuum processing chamber is used.

3. The restoration processing method according to claim 2, wherein it is judged whether said restoration processing is appropriate or not depending on whether said attained pressure in a predetermined lapsed time is within a predetermined range or not.

4. The restoration processing method according to claim 2, wherein a vacuum attainment curve with a lapse of time to reach the attained pressure and attained time at the high vacuum evacuation of the vacuum processing chamber is obtained, and a single or plurality of analytical results of numerical values of an inclination and the like obtained by differential calculation or the like are combined.

5. The restoration processing method according to claim 1, wherein as an item for judging whether or not the restoration processing is appropriate, the residual gas in the vacuum processing chamber by the high vacuum evacuation is accumulated in the vacuum processing chamber by interrupting an exhaust system, e.g., by closing a discharge valve, an electric discharge is performed by an appropriate plasma generating method to observe its emission spectrum so to know residual gas components, and the obtained results are used alone or in combination and over time.

6. The restoration processing method according to claim 5, wherein relative amounts of nitrogen (N), hydrogen (H) or OH may be obtained as said residual gas components, and the results are used alone or in combination and over time.

7. The restoration processing method according to claim 1, wherein as an item for judging whether or not the restoration processing is appropriate, the residual gas components in said vacuum processing chamber by the high vacuum evacuation are known by a mass gas spectrometer or the like, and the obtained results are used alone or in combination and over time.

8. The restoration processing method according to claim 7, wherein among the residual gas components within said vacuum processing chamber, it is judged whether a content ratio of nitrogen and oxygen becomes 4:1 to determine whether there is a leakage from the outside of said vacuum processing chamber.

9. The restoration processing method according to claim 1, wherein as an item for judging whether or not the restoration processing is appropriate, in order to check that the produced amount of foreign substances in said vacuum processing chamber is not more than a prescribed value, a built-in type or separate type foreign substance inspection device is used.

10. The restoration processing method according to claim 9, wherein when the produced amount of foreign substances in said vacuum processing chamber exceeds the prescribed value, a foreign substance reduction sequence is semiautomatically or automatically activated to repeat a gas purge and discharge of the vacuum processing chamber several times.

11. The restoration processing method according to claim 1, wherein as an item for judging whether or not the restoration processing is appropriate, a built-in type or separate type thickness measuring device is used to check that a predetermined etching rate or a film forming rate are within the range of prescribed values.

12. The restoration processing method according to claim 1, wherein as an item for judging whether or not the restoration processing is appropriate, various parameters such as a voltage, a current, a phase and a reflected wave power related to a predetermined plasma discharge are measured, and when said measured values are checked that they are within the range of prescribed values, it is judged that the restoration processing is appropriate.

13. The restoration processing method according to claim 3, wherein it is determined whether said high vacuum evacuation processing is normal or not according to a criterion having a predetermined attainment pressure range for each judging step, and an allowance of the predetermined attainment pressure range is determined to become narrow as the judging steps proceed.

14. The restoration processing method according to claim 13, wherein a warning is issued when the attained pressure is in the proximity of an upper limit or a lower limit of the corresponding criterion in the judging steps.

15. The restoration processing method according to claim 13, wherein the high vacuum evacuation processing is performed again when the attained pressure is out of the corresponding criterion in the judging step.

16. The restoration processing method according to claim 13, wherein the allowance of the predetermined pressure range is determined by obtaining a vacuum attainment curve with a lapse of time.

* * * * *